United States Patent [19]

Hanisch et al.

[11] 4,002,398
[45] Jan. 11, 1977

[54] TERMINAL BLOCK RACK

[75] Inventors: Alfred H. Hanisch, Milwaukee, Wis.; Edward C. Fensholt, Overland Park, Kans.

[73] Assignee: Allen-Bradley Company, Milwaukee, Wis.

[22] Filed: Mar. 17, 1975

[21] Appl. No.: 559,198

[52] U.S. Cl. .................. 339/198 GA; 211/26; 211/170; 317/101 DH; 337/201
[51] Int. Cl.² .................. H01R 9/00; H02B 1/04
[58] Field of Search ......... 211/26, 99, 130, 132, 211/149, 150, 170, 171, 173, 178 R; 337/201, 187; 339/198 R, 198 G, 198 K, 198 GA, 125 R, 245; 317/101 CB, 101 DH, 118

[56] References Cited

UNITED STATES PATENTS

| 457,114 | 8/1891 | Glanzer | 211/173 |
|---|---|---|---|
| 469,686 | 3/1892 | Engle | 211/173 |
| 854,769 | 5/1907 | Spicer | 211/170 X |
| 1,312,861 | 8/1919 | Morris | 211/177 X |
| 1,647,723 | 11/1927 | Casali | 211/150 |
| 1,751,777 | 3/1930 | Victorsohn | 211/99 |
| 2,317,426 | 4/1943 | Wilson | 211/26 X |
| 2,555,074 | 5/1951 | Bergan | 339/245 |
| 3,131,330 | 4/1964 | Allen | 317/101 DH X |
| 3,236,975 | 2/1966 | De Smidt et al. | 337/201 |
| 3,471,029 | 10/1969 | Dolan | 211/26 X |
| 3,472,394 | 10/1969 | Svoboda et al. | 211/171 X |
| 3,665,377 | 5/1972 | MacKenzie | 339/198 G |
| 3,831,128 | 8/1974 | Paluch | 317/118 X |
| 3,904,936 | 9/1975 | Hamrick et al. | 317/118 |

FOREIGN PATENTS OR APPLICATIONS

| 799,469 | 4/1936 | France | 211/178 R |
|---|---|---|---|
| 698,945 | 6/1962 | Italy | 317/101 DH |
| 179,865 | 3/1936 | Switzerland | 337/187 |
| 336,166 | 10/1930 | United Kingdom | 339/198 G |
| 27,839 | 11/1910 | United Kingdom | 211/178 R |

Primary Examiner—Roy D. Frazier
Assistant Examiner—Thomas J. Holko
Attorney, Agent, or Firm—Quarles & Brady

[57] ABSTRACT

A terminal block mounting structure has a mounting bridge pivotally connected to a base bracket. Another mounting bridge is pivotally connected to an intermediate swivel member which is pivotally connected to the base bracket. The mounting bridges, each supporting a set of terminal blocks, are normally disposed in vertical alignment, yet the pivotal connections allow movement of the terminal blocks from the normal vertical plane.

5 Claims, 7 Drawing Figures

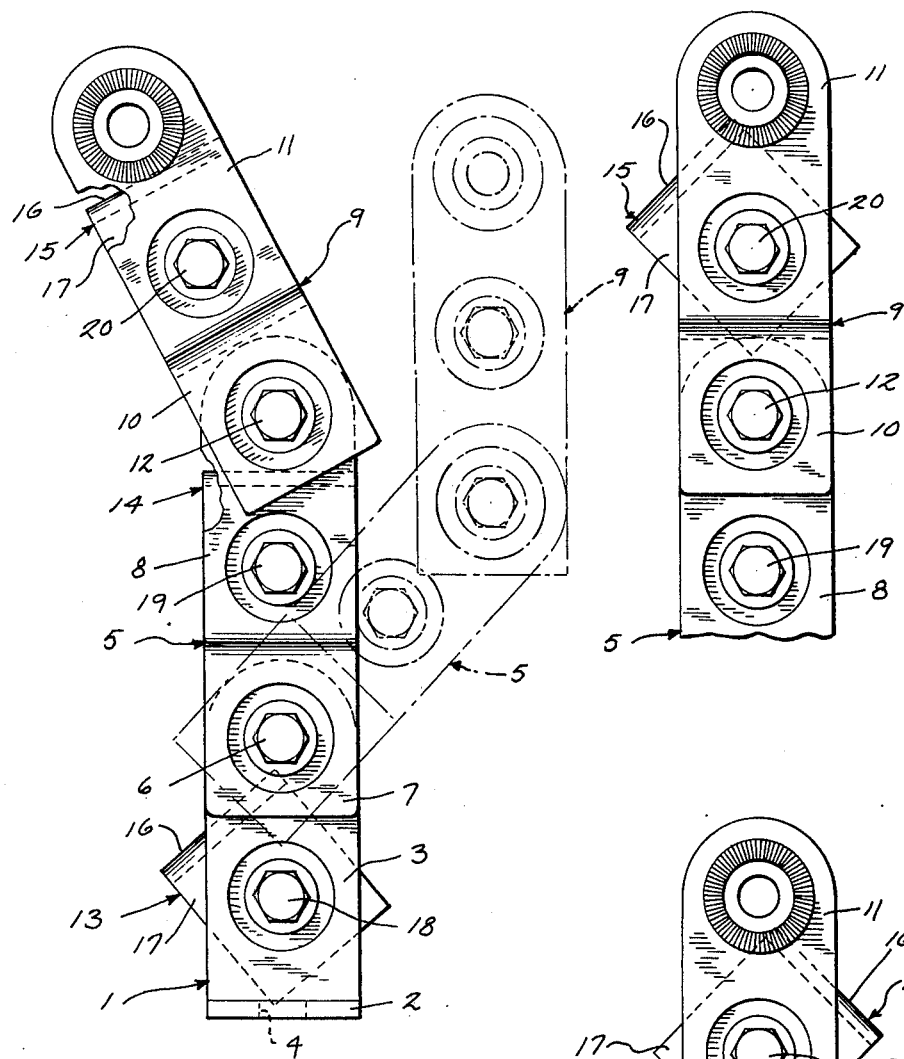
Fig. 5
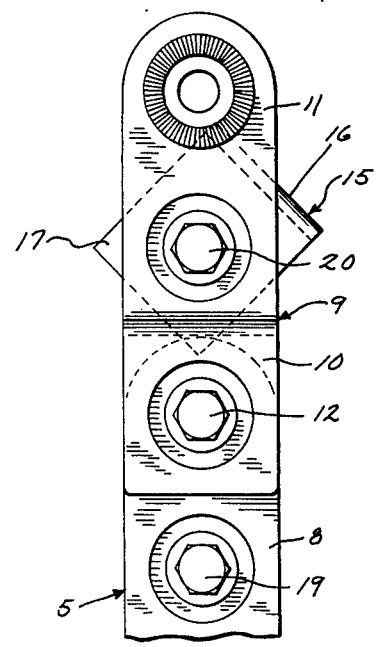
Fig. 6
Fig. 7

TERMINAL BLOCK RACK

BACKGROUND OF THE INVENTION

This invention relates to terminal blocks used in wiring circuits, and, more particularly, to a mounting support rack for such terminal blocks.

Terminal blocks are commonly used in electrical control panels and other circuit wiring. A prior art arrangement which is highly satisfactory is the one which is disclosed in the patent issued to De Smidt et al., U.S. Pat. No. 3,236,975 on Feb. 22, 1966, the claims of which have since been disclaimed. In this patent, a plurality of terminal block segments are removably mounted on a channel-like track.

Typically, the mounting tracks for terminal blocks, such as in the De Smidt et al. reference, are disposed in a single row along the periphery of a surface of an electrical panel. This type of mounting can consume precious surface space in a crowded panel. Also, since the terminal blocks are mounted on the same surface as the electrical circuitry and components, installation and maintenance of the terminal blocks can be inconvenient and time-consuming.

SUMMARY OF THE INVENTION

The present invention contemplates a support rack for terminal blocks having a base bracket, an intermediary member movably connected to the base bracket, and a mounting bridge movably connected to the intermediary member and adapted to mount terminal blocks.

The present invention may also reside in a support rack for terminal blocks which includes a pair of longitudinally opposed upwardly projecting supports adapted for mounting on the surface of an electrical control panel; and a mounting bridge having a pair of ends depending from a span longitudinally extending between the ends, each of the ends movably connected to one of the supports, the span of the mounting bridge being adapted to mount terminal blocks.

It is an object of the invention to provide a support rack for terminal blocks which effects an overall saving of surface area on a control panel. The support rack utilizes control panel depth in that the terminal blocks are mounted on mounting bridges which are normally stacked one above the other. This mounting technique diminishes the amount of surface area required by the terminal blocks.

It is another object of the invention to provide a support rack for terminal blocks which results in greater accessibility to the terminal blocks. The terminal blocks are mounted in a tiered structure in which the lowest level of terminal blocks stands away from the surface of the control panel, and the succeeding levels of terminal blocks are each spaced away from the preceding level. Furthermore, the terminal blocks are disposed on bridges which pivot so that the blocks can be tilted away from their normally disposed positions. Also, the bridges, other than the bridge situated at the lowest level, are fastened to the rack by means of intermediary members which are capable of pivotal movement away from the normal plane in which the terminal blocks reside. This increases the distance that the terminal blocks can be moved from their normal plane. Both pivotal movements enhance accessibility to the terminal blocks during periods of installation, maintenance, and testing.

It is a further object of the invention to provide a support rack for terminal blocks which is highly effective and durable, but is also relatively inexpensive and easy to manufacture, assemble, maintain and use.

The foregoing and other objects and advantages of the invention will appear from the following description. In the description, reference is made to the accompanying drawings which form a part hereof, and in which there is shown by way of illustration and not of limitation a preferred embodiment of the invention. Such embodiment does not represent the full scope of the invention, but rather the invention may be employed in many different embodiments, and reference is made to the claims herein for interpreting the breadth of the invention.

BRIEF DESCRIPTION OF THE DRAWINGS

FIG. 5 is an end view of a terminal block rack shown in two of its possible working positions;

FIG. 6 is a fragmentary end view of a terminal block rack shown in another of its working positions; and FIG. 7 is a fragmentary end view similar to FIG. 6, but showing a terminal block rack in yet another of its working positions.

DESCRIPTION OF THE PREFERRED EMBODIMENT

Figure 1:
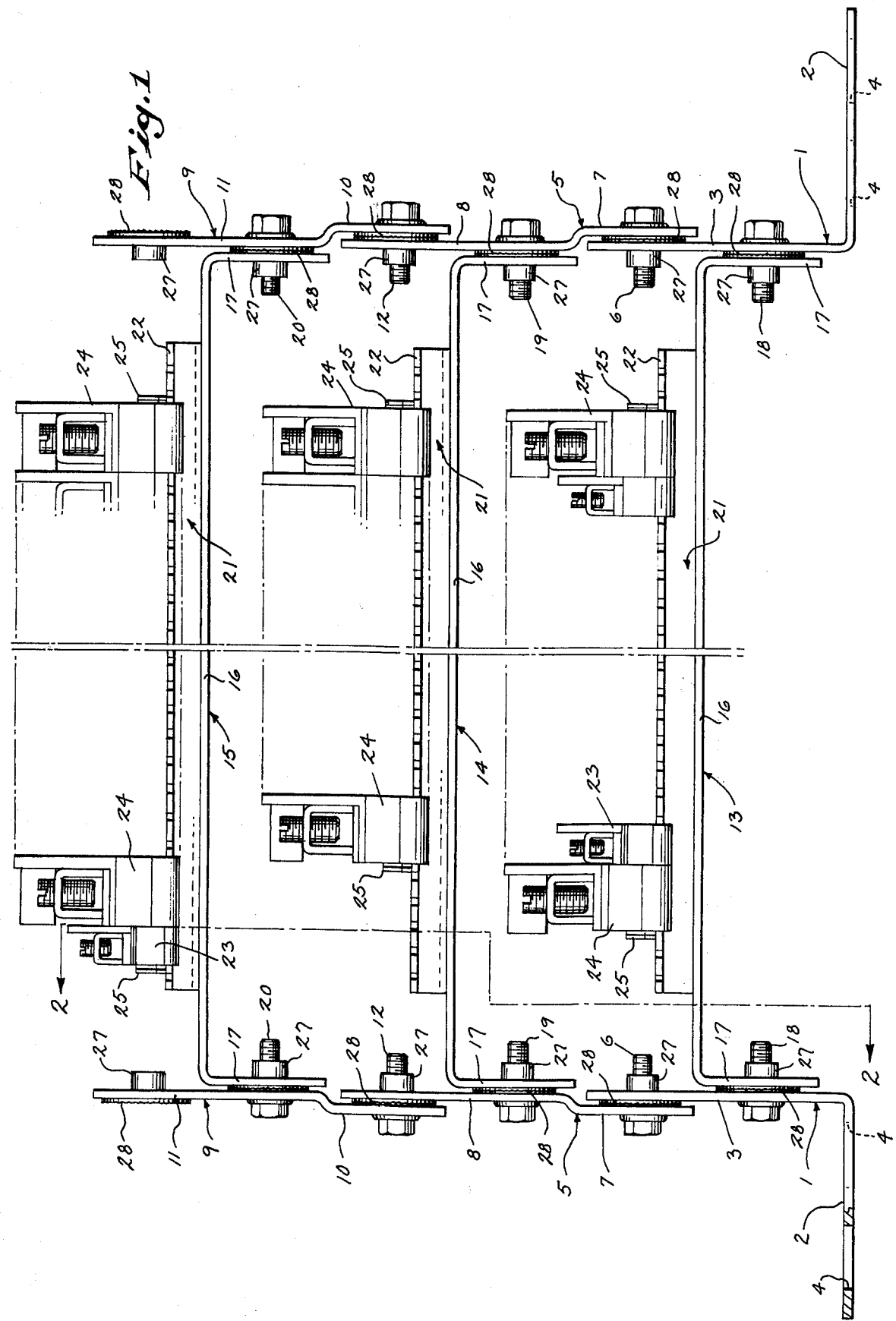
FIG. 1 is a side view in elevation, and partially broken, of a terminal block rack which incorporates the present invention.

Referring particularly to FIG. 1, the terminal block rack shown includes a pair of generally L-shaped base brackets 1, each having a generally horizontal portion 2 integrally connected to a generally vertical portion 3. The horizontal portion 2 of each base bracket 1 has a pair of openings 4 which are capable of receiving bolts or similar securing means that serve to connect the base brackets 1, and hence, the terminal block rack, to the surface of an electrical control panel or other device in which the present invention can be suitably employed. A first swivel member 5 is fastened to the upper end of the vertical portion 3 of each base bracket 1 by a bolt 6— each first swivel member 5 consisting of integrally connected lower and upper generally upright members 7 and 8, respectively. In the preferred embodiment shown in the drawings, a second swivel member 9 is fastened to each of the first swivel members 5. Each second swivel member 9 also consists of integrally connected lower and upper generally upright members, 10 and 11, respectively. The lower upright member 10 of each second swivel member 9 is fastened to the upper end of the upper upright member 8 of one of the first swivel members 5 by a bolt 12. It should be apparent from the description to follow that although a pair of swivel members are shown and described in the preferred embodiment, either one or more than two can be employed in accordance with the principles of the invention.

The combination of the base bracket 1 and the first and second swivel members 5 and 9, respectively, forms a vertically rising support structure. Two such combinations in spaced apart longitudinally opposed relationship are shown in FIG. 1 with three mounting bridges, indicated generally by the reference numerals 13, 14 and 15, extending between these two combinations. Each mounting bridge 13, 14 and 15 includes a level piece 16 which is integrally interposed between a pair of depending rectangular ends 17. Each end 17 of mounting bridge 13 is fastened to the vertical portion 3 of one of the base brackets 1 by a bolt 18. The connection points of the mounting bridge 13 and base brackets 1 are at a vertical height between that of the horizontal portions 2 and the bolts 6. In similar fashion, each end 17 of mounting bridge 14 is fastened to the upper upright member 8 of one of the first swivel members 5 by a bolt 19. The connection points of the mounting bridge 14 and the first swivel members 5 is at a vertical height between that of the bolts 6 and 12. And, likewise, each end 17 of mounting bridge 15 is fastened to the upper upright member 11 of one of the second swivel members 9 by a bolt 20, the connection points of the mounting bridge 15 and the second swivel members 9 being at a vertical height above that of the bolts 12. Thus, the support structure formed by the base brackets 1 and swivel members 5 and 9 constitutes a rack frame-work for the mounting bridges 13, 14 and 15 with the mounting bridges 13, 14 and 15 disposed at different vertical heights.

Figure 2:
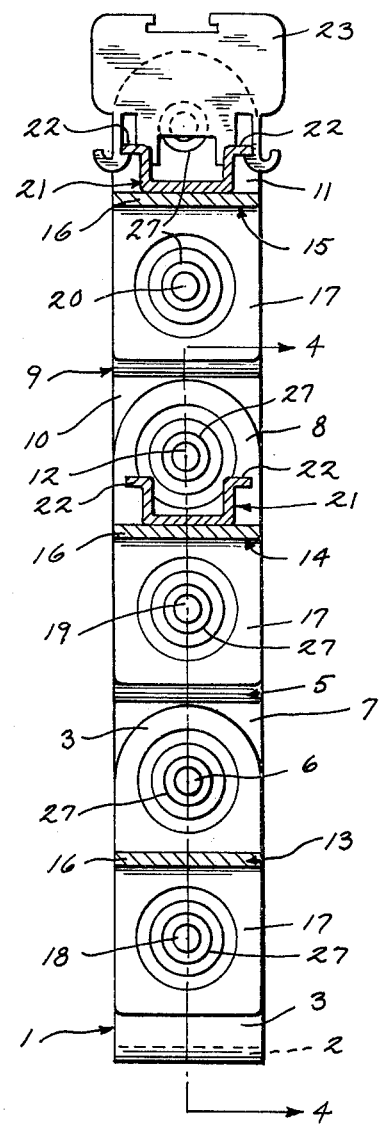
FIG. 2 is a view in cross section taken along the plane of the line 2—2 shown in FIG. 1.
Figure 3:
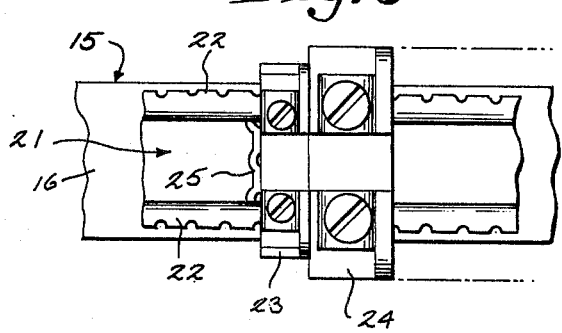
FIG. 3 is a fragmentary top view of the terminal block rack of FIG. 1.

With particular reference to FIGS. 1, 2 and 3, each of the mounting bridges 13, 14 and 15 has a longitudinally extending mounting plate 21 secured to its level piece 16. Each mounting plate 21 has a pair of longitudinal tracks 22 which removably receive a plurality of terminal blocks. Both 300-volt terminal blocks 23 and 600-volt terminal blocks 24 are shown— they are similar in design and are easily mountable in any combination desired on the same mounting plate 21. Retaining brackets 25 removably engage the mounting plate 21 and the outermost terminal blocks on each mounting bridge 13, 14 and 15, and restrain the terminal blocks from longitudinal displacement. It should be readily apparent, however, that the mounting bridges 13, 14 and 15 can accommodate many other types of terminal blocks.

Figure 4:
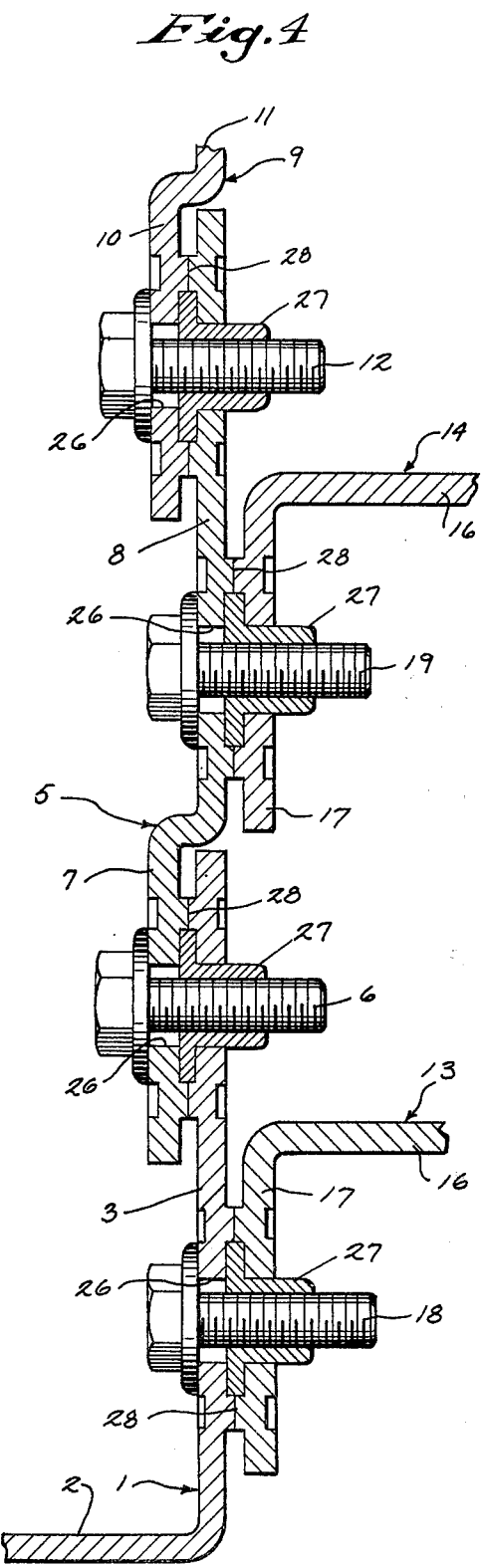
FIG. 4 is a view in cross section taken along the plane of the line 4—4 shown in FIG. 2.

As previously mentioned, first swivel members 5 are fastened to base brackets 1 by bolts 6; second swivel members 9 are fastened to first swivel members 5 by bolts 12; mounting bridge 13 is fastened to base brackets 1 by bolts 18; mounting bridge 14 is fastened to first swivel members 5 by bolts 19; and mounting bridge 15 is fastened to second swivel members 9 by bolts 20. The mounting bridges 13, 14 and 15 are identical as are the swivel members 5 and 9 and the bolts 18, 19, 20, 6 and 12. However, different numerals have been used to differentiate identical elements for ease of description. The interconnections between these fastened elements can be discussed best with reference to FIG. 4. The illustrated interconnections are identical, and only the connection between one of the first swivel members 5 and mounting bridge 14 will be described. It should be understood, however, that the description applies to the interconnections between the other fastened elements as well. The upper upright member 8 of first swivel member 5 has an unthreaded opening 26 having a diameter which exceeds the outside diameter of bolt 19. A threaded plug 27 is press fitted into an opening in the end 17 of mounting bridge 14. Bolt 19 passes through unthreaded opening 26 and is tightened within threaded plug 27, thus securing mounting bridge 14 in engagement with first swivel member 5. Both the mounting bridge 14 and the upper upright member 8 have an annular array of serrations 28 which are radially directed. The serrations 28 are disposed on the opposing surfaces of the end 17 of mounting bridge 13 and base bracket 1, and are in engagement when the mounting bridge 14 is fastened to first swivel member 5. The serrations 28 assist in maintaining the mounting bridge 14 and first swivel member 5 in secured angular relation, even if either or both of them is/are positioned away from normal vertical alignment.

This mounting arrangement efficiently utilizes surface space on an electrical control panel, and, in addition to securing the mounting bridges in the tiered orientation discussed heretofore, the arrangement also facilitates installation and maintenance. The interconnections between the fastened elements maintain the elements in fixed relation, but additionally permit relative pivotal movement between the elements so that the elements can be moved to and held at positions out of alignment with each other. Some of the possible working positions which the elements may assume are shown in FIGS. 5–7. The mounting bridges 13, 14 and 15, and swivel members 5 and 9 are capable of pivotal movement in either a clockwise or counterclockwise direction and to almost any extent desired—the extent only being limited by interference with the bolt head.

All of the mounting bridges and swivel members pivot about their interconnection points and with respect to the corresponding element to which each is fastened. Thus, the bolts 18, 19 and 20 represent points about which the mounting bridges 13, 14 and 15, respectively, pivot, and bolts 6 and 12 are points about which the swivel members 5 and 9, respectively, pivot. All of the mounting bridges and swivel members pivot about horizontal axes passing through the centerline of their respective fastening bolts. Also, all of the horizontal axes about which the mounting bridges and swivel members pivot are parallel with respect to each other.

When it is desired to place any of the mounting bridges or swivel members in a different orientation, its interconnecting bolts are loosened, the element is pivoted to its new position, and the bolts are retightened. The serrations 28 on the opposing surfaces of the fastened elements serve to assist in maintaining the elements in secured relation regardless of the orientation, or angle, at which the elements are disposed with respect to each other.

Each mounting bridge and swivel members pivots about its own independent, horizontal axis running longitudinally of the mounting structure. This aspect of the invention allows for great flexibility in positioning the terminal block tiers which are fastened to the structure. The base brackets of the mounting rack structure can be secured near any wall of a control panel, or like apparatus, as well as at a distance inwardly from the panel periphery, yet the mounting bridges and swivel members can be pivoted from the structure for accessibility to the terminal blocks. Since each mounting bridge and swivel member can pivot about its own independent axis, the bridges and swivel members can assume a wide variety of positions with respect to each other, thereby enhancing flexibility of use. For example, in FIG. 5, in dotted outline swivel member 5 is pivoted away from its normal position—thus, the terminal blocks on the lowest mounting bridge 13 are fully accessible. The mounting bridge 13 then can be pivoted in either direction for increased convenience in performing maintenance or any other operation on the terminal blocks.

It also should be apparent that the mounting structure provides longitudinal flexibility. The mounting bridges can be constructed of any length, and, of course, any number of mounting rack structures can be mounted on a panel. Thus, almost any number of terminal blocks desired can be mounted within a given amount of available space.

The invention provides a terminal block mounting structure having multiple advantages. The mounting structure efficiently utilizes available space within an environment that is highly concentrated with electrical circuitry, yet augments accessibility to the terminal blocks mounted thereon during periods of installation, maintenance and testing. The flexibility of movement of the tiers containing the terminal blocks allows mounting of the structure at virtually any point within a maze of circuitry, but permits access to the terminal blocks from almost any angle. The invention provides a highly effective way of overcoming common and serious problems.

We claim:

1. In combination with an electrical control panel wherein electrical equipment is mounted, and wherein terminal blocks are positioned, the improvement which comprises:

a pair of longitudinally opposed supports mounted to said control panel and extending outwardly therefrom;

a pair of intermediary members, each being connected to one of said supports and being normally disposed substantially coplanar with said supports, but being selectively pivotal in either a clockwise or counterclockwise direction away from its normal position to assume a second position outside of the plane of said supports;

a mounting bridge having a pair of ends depending from a span longitudinally extending between said ends, each of said ends being pivotally connected to one of said intermediary members and said span having a plurality of terminal blocks mounted thereon;

the span of said mounting bridge being normally disposed substantially perpendicular to the plane of said intermediary members, but being selectively pivotal in either a clockwise or counterclockwise direction away from its normal position to assume a second position; and the span of said mounting bridge and said intermediary members being independently pivotal and capable of pivoting in opposite directions with respect to one another.

2. The combination of claim 1, including:

a second mounting bridge having a pair of ends depending from a span longitudinally extending between said ends, each of said ends being pivotally connected to one of said supports, and wherein:

the span of said second mounting bridge has a plurality of terminal blocks mounted thereon;

the span of said second mounting bridge is normally disposed substantially perpendicular to the plane of said supports, but is selectively pivotal in either a clockwise or counterclockwise direction away from its normal position to assume a second position;

the pivotal movement of the span of said second mounting bridge is independent of the pivotal movement of the span of said first mounting bridge and is independent of the pivotal movement of said intermediary members; and the span of said second mounting bridge, the span of said first mounting bridge and said intermediary members are capable of pivoting in opposite directions with respect to one another.

3. The combination of claim 2, wherein:

each of said supports has an upward surface facing the other of said supports, each of the upward surfaces having a first annular array of serrations;

each of the ends of said second mounting bridge has a second annular array of serrations engaging the first annular array of serrations on one of said supports to maintain said second mounting bridge and said supports in secured relation both when said second mounting bridge is in its normal position and when said second mounting bridge is in its second position;

each of said supports has a second upward surface facing in a direction opposite to the other of said supports, each of the second upward surfaces having a third annular array of serrations; and each of said intermediary members has a fourth annular array of serrations engaging the third annular array of serrations on one of said supports to maintain said intermediary members and said supports in secured relation both when said intermediary members are in their normal positions and when said intermediary members are in their second positions.

4. The combination of claim 2 including:

a second pair of intermediary members, each being connected to one of said first intermediary members and being normally disposed substantially coplanar with said first intermediary members, but being selectively pivotal in either a clockwise or counterclockwise direction away from its normal position to assume a second position outside of the plane of said first intermediary members, and wherein:

the pivotal movement of said second intermediary members is independent of the pivotal movements of the span of said first mounting bridge, said first intermediary members, and the span of said second mounting bridge;

a third mounting bridge having a pair of ends depending from a span longitudinally extending between said ends, each of said ends being pivotally connected to one of said second intermediary members, and wherein:

the span of said third mounting bridge has a plurality of terminal blocks mounted thereon;

the span of said third mounting bridge is normally disposed substantially perpendicular to the plane of said second intermediary members, but is selectively pivotal in either a clockwise or counterclockwise direction away from its normal position to assume a second position;

the pivotal movement of the span of said third mounting bridge is independent of the pivotal movements of the span of said first mounting bridge, the span of said second mounting bridge, said second intermediary members and said first intermediary members; and the span of said third mounting bridge, the span of said second mounting bridge, the span of said first mounting bridge, said first intermediary members and said second intermediary members are all capable of pivoting in opposite directions with respect to one another.

5. The combination of claim 4, wherein:

each of said first intermediary members has a surface facing the other of said first intermediary members, each of the surfaces having a fifth annular array of serrations;

each of the ends of said first mounting bridge has a sixth annular array of serrations engaging the fifth annular array of serrations on one of said first intermediary members to maintain said first mounting bridge and said first intermediary members in secured relation both when said first mounting bridge is in its normal position and when said first mounting bridge is in its second position;

each of said first intermediary members has a second surface facing in a direction opposite to the other of said first intermediary members, each of the second surfaces having a seventh annular array of serrations; and each of said second intermediary members has an eighth annular array of serrations engaging the seventh annular array of serrations on one of said first intermediary members to maintain said second intermediary members and said first intermediary members in secured relation both when said second intermediary members are in their normal positions and when said second intermediary members are in their second positions.

* * * * *